US012598951B2

(12) United States Patent
Usami et al.

(10) Patent No.: US 12,598,951 B2
(45) Date of Patent: Apr. 7, 2026

(54) WAFER PLACEMENT TABLE

(71) Applicant: NGK INSULATORS, LTD.,
Nagoya-City (JP)

(72) Inventors: Taro Usami, Kasamatsu-Town (JP);
Yohei Kajiura, Nagoya-City (JP);
Keita Ikegami, Nagoya-City (JP)

(73) Assignee: NGK INSULATORS, LTD., Nagoya
(JP)

( * ) Notice: Subject to any disclaimer, the term of this
patent is extended or adjusted under 35
U.S.C. 154(b) by 113 days.

(21) Appl. No.: 18/581,577

(22) Filed: Feb. 20, 2024

(65) Prior Publication Data

US 2024/0412998 A1 Dec. 12, 2024

Related U.S. Application Data

(63) Continuation of application No. PCT/JP2023/021151,
filed on Jun. 7, 2023.

(51) Int. Cl.
*H01L 21/683* (2006.01)

(52) U.S. Cl.
CPC ............................... *H01L 21/6833* (2013.01)

(58) Field of Classification Search
CPC .......... H01L 21/6833; H01L 21/67109; H01L
21/6831; H01L 21/68785
See application file for complete search history.

(56) References Cited

U.S. PATENT DOCUMENTS

| | | | | |
|---|---|---|---|---|
| 2008/0178608 A1* | 7/2008 | Tandou | ................... | F25B 39/02 |
| | | | | 62/515 |
| 2008/0289767 A1* | 11/2008 | Tandou | ............. | H01L 21/67109 |
| | | | | 156/345.37 |
| 2009/0277883 A1 | 11/2009 | Tandou et al. | | |
| 2010/0126666 A1* | 5/2010 | Tandou | ............. | H01L 21/67109 |
| | | | | 156/345.27 |
| 2015/0376783 A1* | 12/2015 | Hanamachi | ....... | H01L 21/68785 |
| | | | | 118/500 |
| 2017/0133244 A1* | 5/2017 | Knyazik | ................... | F28D 7/04 |

(Continued)

FOREIGN PATENT DOCUMENTS

| | | |
|---|---|---|
| JP | 2006-032701 A | 2/2006 |
| JP | 2009-272535 A | 11/2009 |

(Continued)

OTHER PUBLICATIONS

Korean Office Action (with English translation) dated Jan. 7, 2025
(Application No. 10-2024-7005846).

(Continued)

*Primary Examiner* — Nelson J Nieves
(74) *Attorney, Agent, or Firm* — BURR PATENT LAW,
PLLC

(57) ABSTRACT

A wafer placement table includes: a ceramic plate having a
wafer placement surface on its upper surface; a cooling plate
provided on a lower surface of the ceramic plate; and a
refrigerant flow path provided inside the cooling plate,
wherein the refrigerant flow path includes a first portion and
a second portion, the second portion continuing from the
first portion and being divided into two or more ways
forming branches that run side by side, and wherein the first
portion has a cross-sectional area smaller than a sum of
cross-sectional areas of the respective branches included in
the second portion.

9 Claims, 9 Drawing Sheets

(56) References Cited

U.S. PATENT DOCUMENTS

| | | | |
|---|---|---|---|
| 2019/0088517 A1* | 3/2019 | Kosakai ............ | H01L 21/67103 |
| 2020/0251371 A1* | 8/2020 | Kuno ................. | H01L 21/6831 |
| 2020/0312684 A1 | 10/2020 | Mine et al. | |
| 2020/0335385 A1* | 10/2020 | Saitou .............. | H01L 21/67098 |
| 2021/0043476 A1 | 2/2021 | Koizumi et al. | |
| 2021/0043489 A1* | 2/2021 | Satake ................ | H01L 21/6831 |
| 2021/0398840 A1* | 12/2021 | Aikawa ............ | H01L 21/68785 |
| 2022/0246451 A1* | 8/2022 | Takebayashi ....... | H01L 21/6833 |
| 2022/0399223 A1* | 12/2022 | Kuno ............... | H01L 21/68757 |
| 2022/0415693 A1* | 12/2022 | Saito ................ | H01J 37/32522 |
| 2024/0006194 A1* | 1/2024 | Kojima ............ | H01L 21/68785 |
| 2024/0404860 A1* | 12/2024 | Kuo .................. | H01J 37/32091 |
| 2025/0125165 A1* | 4/2025 | Kanakasabapathy ........................ | H01L 21/67115 |
| 2025/0183082 A1* | 6/2025 | Uematsu .............. | H01L 21/683 |

FOREIGN PATENT DOCUMENTS

| | | | |
|---|---|---|---|
| JP | 2010-272873 | A | 12/2010 |
| JP | 2014-175491 | A | 9/2014 |
| JP | 2016-174060 | A | 9/2016 |
| JP | 2020-161597 | A | 10/2020 |
| JP | 2021-028961 | A | 2/2021 |
| KR | 10-2020-0052973 | A | 5/2020 |
| WO | 2019/088204 | A1 | 5/2019 |

OTHER PUBLICATIONS

International Search Report and Written Opinion (Application No. PCT/JP2023/021151) dated Aug. 22, 2023 (7 pages).
English translation of the International Preliminary Report on Patentability (Chapter I) (Application No. PCT/JP2023/021151) dated Dec. 18, 2025 (6 pages).

* cited by examiner

WAFER PLACEMENT TABLE

BACKGROUND OF THE INVENTION

1. Field of the Invention

The present invention relates to a wafer placement table.

2. Description of the Related Art

Some known arts relate to a wafer placement table including a ceramic plate having an upper surface serving as a wafer placement surface, a cooling plate provided on a lower surface of the ceramic plate, and a refrigerant flow path provided inside the cooling plate. In a wafer placement table disclosed by PTL 1, for example, the cooling plate is made of a material having a high thermal conductivity, such as Al. Furthermore, the distance between the upper surface of the refrigerant flow path and the wafer placement surface is constant from the inlet to the outlet of the refrigerant flow path. Furthermore, the refrigerant flow path has a cross-sectional shape that varies with the position in the refrigerant flow path. According to PTL 1, the flow path has a cross-sectional area that is smaller at a portion thereof corresponding to a portion of the wafer placement surface where the temperature is relatively high than at a portion thereof corresponding to a portion of the wafer placement surface where the temperature is relatively low. Furthermore, the width of the upper surface of the refrigerant flow path is constant from the inlet to the outlet of the refrigerant flow path. Furthermore, the length of the refrigerant flow path in the heightwise direction is shorter at a position corresponding to the portion of the wafer placement surface where the temperature is relatively high than at a position corresponding to the portion of the wafer placement surface where the temperature is relatively low.

CITATION LIST

Patent Literature

PTL 1: Japanese Unexamined Patent Application Publication No. 2021-28961

SUMMARY OF THE INVENTION

In the configuration according to PTL 1, the nonuniformity in heat removal to be achieved through the refrigerant flow path is reduced by improving the cross-sectional shape of the cooling plate. For example, if the width allowed for providing the refrigerant flow path is small, the flow-path cross-sectional area in a portion corresponding to an area of the wafer placement surface where the temperature is relatively low may be insufficient, resulting in an insufficient reduction of the nonuniformity in heat removal.

The present invention is to solve the above problem, and a main object of the present invention is to reduce the temperature nonuniformity at a wafer placement surface of a wafer placement table.

[1] A wafer placement table of the present invention includes a ceramic plate having a wafer placement surface on its upper surface, a cooling plate provided on a lower surface of the ceramic plate, and a refrigerant flow path provided inside the cooling plate, wherein the refrigerant flow path includes a first portion and a second portion, the second portion continuing from the first portion and being divided into two or more ways forming branches that run side by side, and wherein the first portion has a cross-sectional area smaller than a sum of cross-sectional areas of the respective branches included in the second portion.

In the present wafer placement table, the refrigerant flow path includes the first portion and the second portion. The second portion continues from the first portion and is divided into two or more ways forming the branches that run side by side. Therefore, for example, even if the width allowed for providing the refrigerant flow path is small, the second portion as a whole is allowed to have a relatively large flow-path cross-sectional area with the branches in the second portion being individually provided within such a width. Furthermore, the first portion has a cross-sectional area smaller than the sum of the cross-sectional areas of the respective branches included in the second portion. Therefore, in the refrigerant flow path, the flow speed is faster and the cooling efficiency is higher in the first portion than in the second portion. Hence, in the wafer placement table, adjusting the arrangement of the first portion and the second portion; for example, locating the first portion in correspondence with a high-cooling-need area, reduces the temperature nonuniformity at the wafer placement surface.

[2] In the wafer placement table according to the present invention (the wafer placement table according to [1] above), the first portion may be located in correspondence with an outer peripheral area of the wafer placement surface, and the second portion may be located in correspondence with a central area of the wafer placement surface. In general, the input of plasma heat to the wafer placement table is greater for the outer peripheral area of the wafer placement surface than for the central area. Considering such a situation, the first portion and the second portion are arranged as above, whereby the cooling efficiency in the outer peripheral area of the wafer placement surface is made higher than in the central area. Consequently, the temperature nonuniformity at the wafer placement surface is reduced effectively.

[3] In the wafer placement table according to the present invention (the wafer placement table according to [2] above), the ceramic plate may have an annular focusing placement surface provided around the wafer placement surface and located at a lower level than the wafer placement surface, and the focus-ring placement surface may be designed to receive an annular focus ring whose outside diameter is greater than an outside diameter of the ceramic plate and an outside diameter of the cooling plate. In such a case, the focus ring extends outward beyond (overhangs) the wafer placement table. Therefore, the outer peripheral area of the wafer placement surface is more likely to have a high temperature. Hence, the application of the present invention provides a great significance.

[4] In the wafer placement table according to the present invention (the wafer placement table according to any of [1] to [3] above), the cross-sectional areas of the respective branches in the second portion may each be greater than $\frac{1}{2}$ of the cross-sectional area of the first portion. The greater the cross-sectional areas of the branches in the second portion, the slower the flow speeds in the branches. Accordingly, the flow speed in the first portion becomes relatively faster. Consequently, the nonuniformity in heat removal is further reduced.

[5] In the wafer placement table according to the present invention (the wafer placement table according to any of [1] to [4] above), the refrigerant flow path may include a turn portion where the flow path is reversely directed, and the refrigerant flow path may be divided into two ways at a halfway position in the turn portion such that unevenness in an amount of refrigerant distribution between the branches in the second portion is reduced. In such a design, the unevenness in the capacity of heat removal between the branches is reduced. Consequently, the nonuniformity in heat removal is further reduced.

[6] In the wafer placement table according to the present invention (the wafer placement table according to any of [1] to [4] above), the refrigerant flow path may be divided into a branch that has a tendency continuing from a curve preceding the division, and a branch that temporarily deviates outward from the tendency of the preceding curve, and such that unevenness in an amount of refrigerant distribution between the branches in the second portion is reduced. In such a design as well, the unevenness in the capacity of heat removal between the branches is reduced. Consequently, the nonuniformity in heat removal is further reduced.

[7] In the wafer placement table according to the present invention (the wafer placement table according to any of [1] to [6] above), in plan view, a non-flow-path area that is defined as a size of an area where the refrigerant flow path is not provided may be 50% or greater in an area over which the second portion spreads. The greater the non-flow-path area, the higher the degree of freedom in the arrangement of elements other than the refrigerant flow path.

[8] In the wafer placement table according to the present invention (the wafer placement table according to any of [1] to [7] above), the wafer placement surface may include a high-cooling-need area and a low-cooling-need area, the first portion may be located in correspondence with the high-cooling-need area of the wafer placement surface, and the second portion may be located in correspondence with the low-cooling-need area of the wafer placement surface. For example, the high-cooling-need area may be the outer peripheral area of the wafer placement surface, and the low-cooling-need area may be the central area of the wafer placement surface.

[9] In the wafer placement table according to the present invention (the wafer placement table according to any of [1] to [8] above), the efficiency of heat exchange in an area of the wafer placement surface that corresponds to the first portion may be higher than the efficiency of heat exchange in an area of the wafer placement surface that corresponds to the second portion. In such a case, the area of the wafer placement surface that corresponds to the first portion may be the outer peripheral area of the wafer placement surface, and the area of the wafer placement surface that corresponds to the second portion may be the central area of the wafer placement surface.

DETAILED DESCRIPTION OF THE INVENTION

First Embodiment

Figure 1:
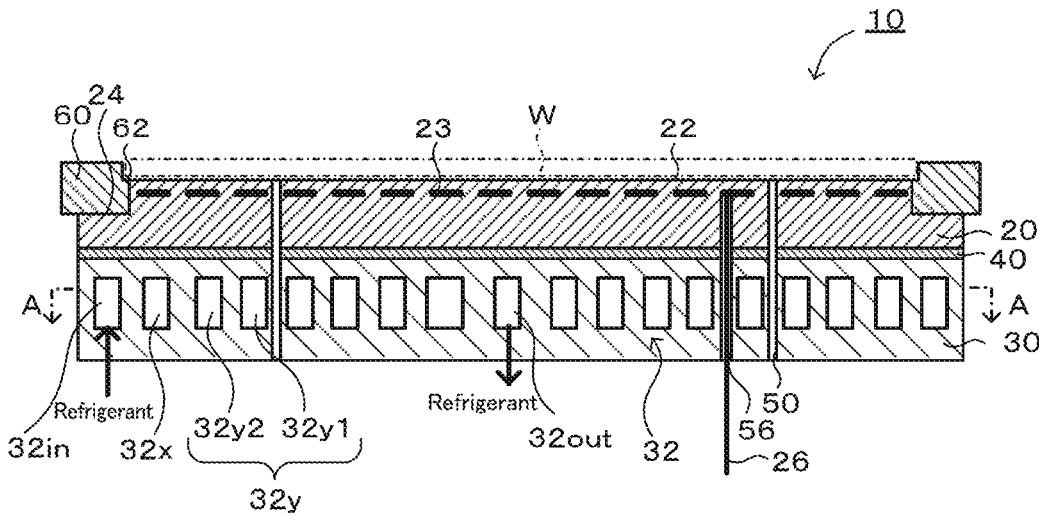
FIG. 1 is a sectional view of a wafer placement table 10.
Figure 2:
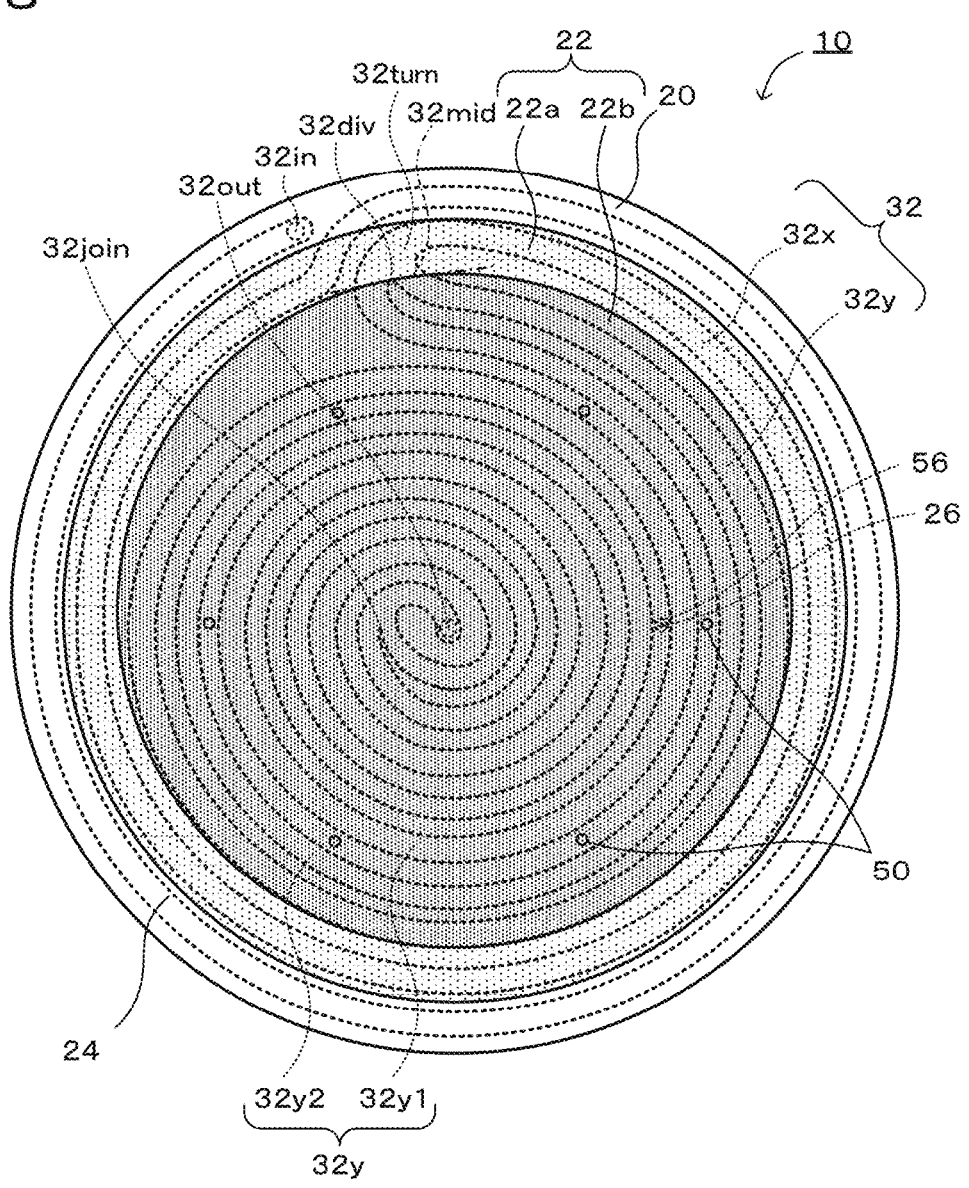
FIG. 2 is a plan view of the wafer placement table 10.
Figure 3:
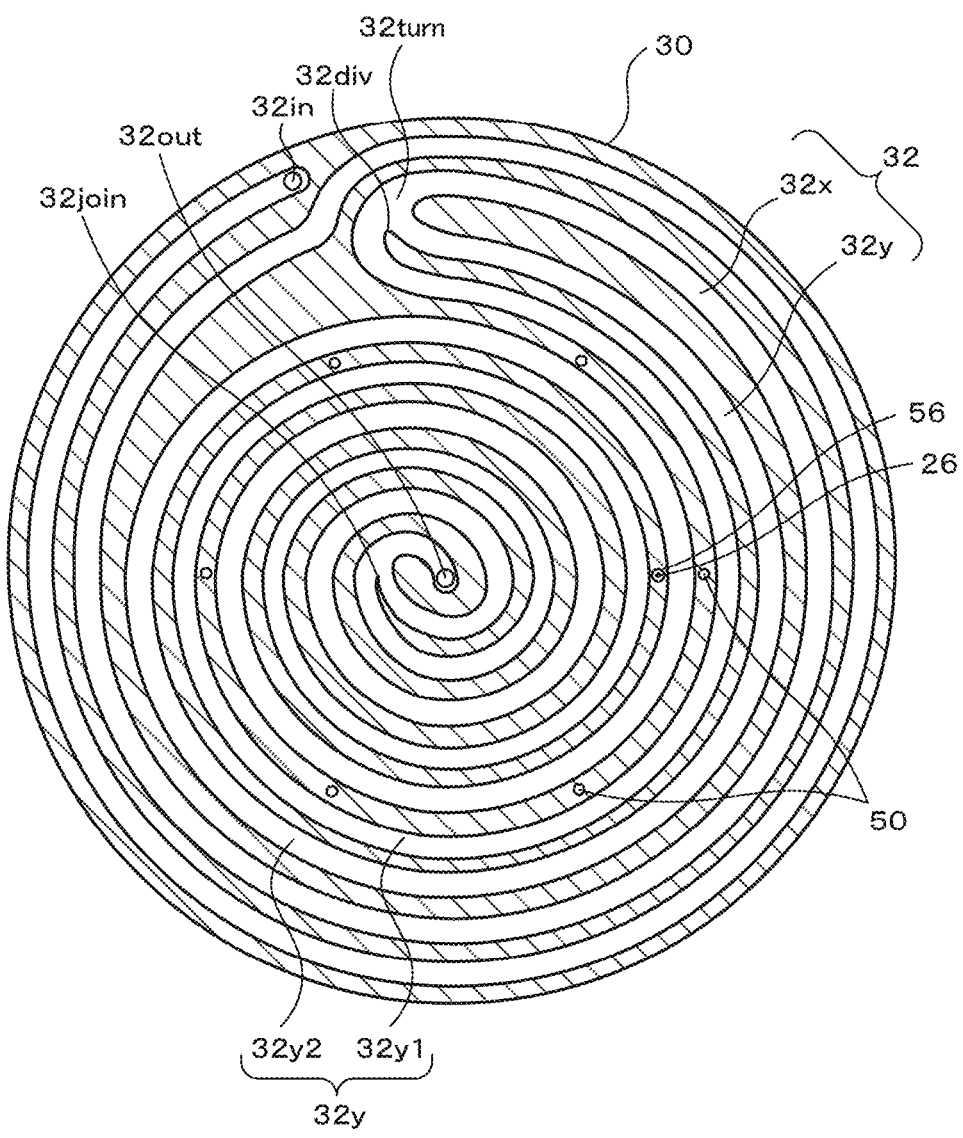
FIG. 3 illustrates a section taken along line A-A given in FIG. 1.
Figure 4:
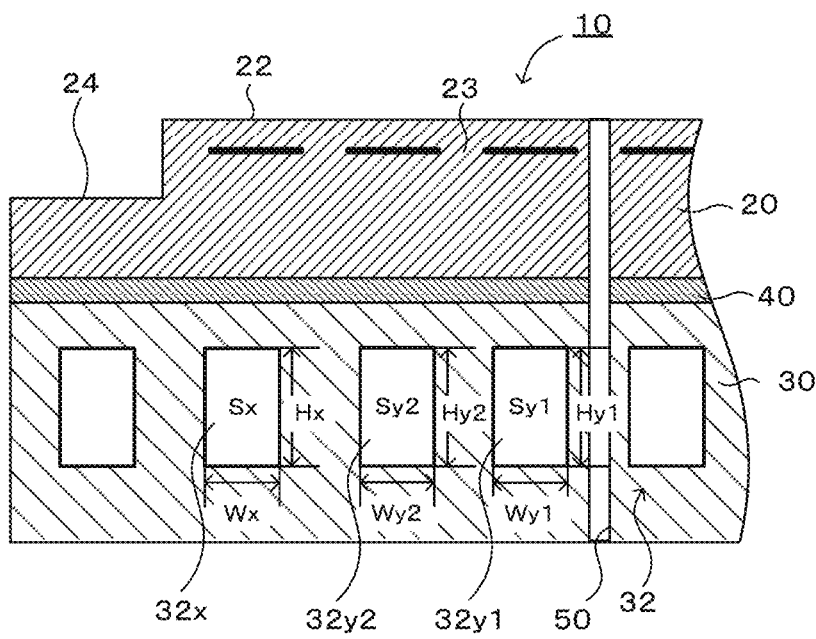
FIG. 4 is an enlargement of a part illustrated in FIG. 1.
Figures 5A, 5B, 5C:
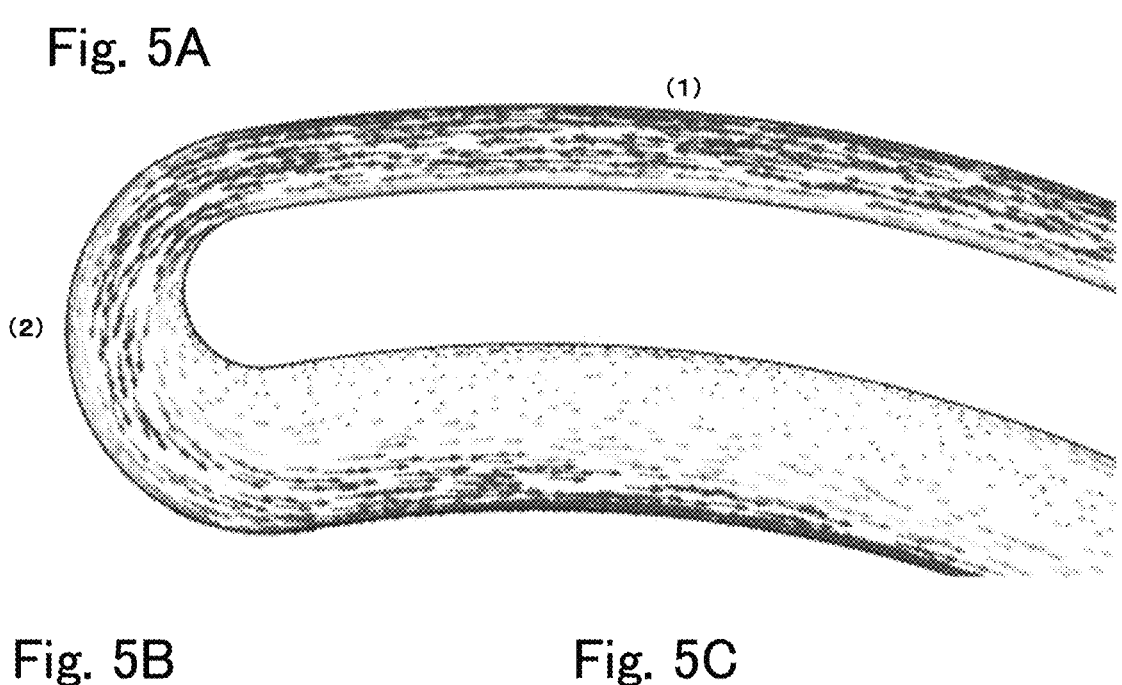
FIG. 5A to 5C illustrate the result of an examination of how refrigerant flows in a refrigerant flow path.

A first embodiment of the present invention will now be described with reference to drawings. FIG. 1 is a sectional view of a wafer placement table 10 (a sectional view of the wafer placement table 10 that is taken along a plane containing the center axis of the wafer placement table 10). FIG. 2 is a plan view of the wafer placement table 10. FIG. 3 illustrates a section taken along line A-A given in FIG. 1. FIG. 4 is an enlargement of a part illustrated in FIG. 1. FIG. 5A to 5C illustrate the result of an examination of how refrigerant flows in a refrigerant flow path. FIG. 5A is a vector diagram illustrating the flow-speed distribution in the refrigerant flow path (the original diagram is a color diagram representing the flow speed by the following colors in descending order: red→orange→yellow→green→blue→indigo→purple). FIGS. 5B and 5C illustrate preferable branching forms.

The wafer placement table 10 is intended to perform CVD, etching, or the like on a wafer W by using plasma. The wafer placement table 10 includes a ceramic plate 20, a cooling plate 30, and a joining layer 40.

The ceramic plate 20 is made of a ceramic material represented by alumina, aluminum nitride, or the like. The ceramic plate 20 has a wafer placement surface 22, an electrostatic electrode 23, and a focus-ring placement surface 24. Hereinafter, focus ring may be abbreviated to "FR".

The wafer placement surface 22 is a circular surface and forms an upper surface of the ceramic plate 20. The wafer W is to be placed on the wafer placement surface 22. The wafer placement surface 22 has a plurality (six in the present embodiment) of gas holes 50, which are open in such a manner as to extend through the wafer placement table 10 in an up-down direction. A heat-conductive gas such as He gas is to be supplied from a gas supply source, which is not illustrated. The wafer placement surface 22 is provided with an annular seal band, which is not illustrated, along the outer edge thereof. The area surrounded by the seal band has a plurality of round small projections provided over the entirety of the area. The seal band and the round small projections are of the same height, which is several μm to several 10s of μm, for example. The wafer placement surface 22 includes an area that tends to have a high temperature (a high-cooling-need area) and an area that does not tends to have a high temperature (a low-cooling-need area). In the present embodiment, the input of plasma heat with which the wafer W is to be processed is greater on the outer peripheral side. Accordingly, in the wafer placement surface 22, as illustrated in FIG. 2, an outer peripheral area 22a (the area illustrated with light hatching) is the high-cooling-need area, and a central area 22b (the area illustrated with dark hatching) is the low-cooling-need area.

The electrostatic electrode 23 is a flat mesh electrode or plate electrode and is connected to a direct-current power source, not illustrated, through a power-feeding terminal 26. When a direct-current voltage is applied to the electrostatic electrode 23, the wafer W is electrostatically attracted to the wafer placement surface 22 (specifically, the upper surface of the seal band and the upper surfaces of the round small projections). When the application of the direct-current voltage is disabled, the attraction of the wafer W to the wafer placement surface 22 is disabled. The power-feeding terminal 26 is to be inserted into a terminal hole 56, which is provided in the wafer placement table 10 and extends between the lower surface of the electrostatic electrode 23 and the lower surface of the cooling plate 30.

The FR placement surface 24 is provided around the wafer placement surface 22 and has an annular shape. The FR placement surface 24 is located at a lower level than the wafer placement surface 22. The FR placement surface 24 is designed to receive an annular focus ring 60. The focus ring 60 is made of, for example, Si. In an upper part of the inner sidewall of the focus ring 60 is provided with a circumferential groove 62, with which the focus ring 60 avoids touching the wafer W. The outside diameter of the focus ring 60 is greater than the outside diameter of the ceramic plate 20 and the outside diameter of the cooling plate 30. Therefore, the focus ring 60 is to be placed on the FR placement surface 24 in such a manner as to extend outward beyond (overhang) the wafer placement table 10.

The cooling plate 30 is a disc-like plate having a refrigerant flow path 32, in which refrigerant is allowed to circulate. As illustrated in FIG. 3, in plan view, the refrigerant flow path 32 extends from one end (inlet 32*in*) thereof to the other end (outlet 32*out*) thereof in such a manner as to spread over the entirety of the ceramic plate 20. The refrigerant flow path 32 according to the present embodiment has a swirling shape in plan view. The cooling plate 30 configured as above may be obtained through, for example, diffusion bonding of a plurality of laminar members. The refrigerant is to be supplied from a refrigerant circulator, not illustrated, to the inlet 32 in of the refrigerant flow path 32, flows through the refrigerant flow path 32, is discharged from the outlet 32*out* of the refrigerant flow path 32, and returns to the refrigerant circulator. The refrigerant circulator is capable of adjusting the refrigerant to have a desired temperature. The refrigerant may preferably be liquid and be electrically insulating. Examples of the electrically insulating liquid include fluorine-based inert liquid.

The material for the cooling plate 30 may be a metal material, a metal-ceramic composite, or the like. The metal material may be Al, Ti, Mo, any of alloys thereof, or the like. The metal-ceramic composite may be a metal-matrix composite (MMC), a ceramic-matrix composite (CMC), or the like. Specific examples of such composites include a material containing Si, SiC, and Ti (also referred to as SiSiCTi), a material obtained by impregnating a SiC porous body with Al and/or Si, and a composite of $Al_2O_3$ and TiC. In view of reducing the warpage of the wafer placement table 10, the cooling plate 30 may preferably be made of a material having a coefficient of thermal expansion that is close to that of the ceramic plate 20. If the ceramic plate 20 is made of alumina, the cooling plate 30 may preferably be made of pure Ti or an $\alpha$-$\beta$ Ti alloy. This is because the coefficient of thermal expansion of pure Ti or the $\alpha$-$\beta$ Ti alloy is close to the coefficient of thermal expansion of alumina. In view of increasing the capacity of heat removal, the material for the cooling plate 30 may preferably be of high thermal conductivity, such as Al. The thermal conductivity of Al is 150 to 200 W/mK. The cooling plate 30 may be made of a material having a lower thermal conductivity than Al. Examples of such a material include a Ti-containing material. The cooling plate 30 may have a thermal conductivity of 50 W/mK or lower, or 5 to 20 W/mK. For example, pure Ti has a thermal conductivity of 17 W/mk, and the $\alpha$-$\beta$ Ti alloy has a thermal conductivity of 7.5 W/mK. Alternatively, the cooling plate 30 may be made of an electrically conductive material.

The joining layer 40 joins the lower surface of the ceramic plate 20 and the upper surface of the cooling plate 30 to each other. The joining layer 40 may be, for example, a metal layer made of solder or a metal brazing material, or may be a resin layer made of resin adhesive.

The refrigerant flow path 32 will now be described in detail. As illustrated in FIG. 2, the refrigerant flow path 32 includes a first portion 32*x* and a second portion 32*y*. The first portion 32*x* corresponds to the outer peripheral area 22*a* (the high-cooling-need area) of the wafer placement surface 22. The second portion 32*y* corresponds to the central area 22*b* (the low-cooling-need area). In the refrigerant flow path 32, the first portion 32*x* corresponding to the outer peripheral area 22*a* is a portion of the refrigerant flow path 32 that extends from the inlet 32 in to a middle position 32*mid*. In the refrigerant flow path 32, the second portion 32*y* corresponding to the central area 22*b* is a portion of the refrigerant flow path 32 that extends from the middle position 32*mid* to the outlet 32*out*. The second portion 32*y* is divided at a division point 32*div*, which is defined at the middle position 32*mid*, into two ways forming a branch 32*y*1 and a branch 32*y*2, which join at a joining point 32*join* before reaching the outlet 32*out*. While FIGS. 2 and 3 illustrate an arrangement in which the division point 32*div* is defined at the middle position 32*mid*, the division point 32*div* may alternatively be defined at a position away from the middle position 32*mid*.

The refrigerant flow path 32 includes a turn portion 32*turn*, where the flow path is reversely directed. The refrigerant flow path 32 is divided at the division point 32*div*, which is defined at a halfway position in the turn portion 32*turn*, into two ways forming the branch 32*y*1 and the branch 32*y*2. At the turn portion 32*turn*, the refrigerant flow path 32 running counterclockwise from the inlet 32 in to the turn portion 32*turn* is reversely directed to run clockwise from the turn portion 32*turn* to the outlet 32*out*. The refrigerant flow path 32 is designed to be divided at the division point 32*div* defined at a halfway position in the turn portion 32*turn* into two ways forming the branch 32*y*1 and the branch 32*y*2. Such a design prevents refrigerant distribution from being concentrated in one of the branches 32*y*1 and 32*y*2 (this feature will be described separately below with reference to FIG. 5A to 5C).

As illustrated in FIG. 4, letting the flow-path cross-sectional area of the refrigerant flow path 32 be S, a flow-path cross-sectional area Sx is smaller than the sum of flow-path cross-sectional areas Sy1 and Sy2; that is, Sx<Sy1+Sy2. The flow-path cross-sectional area Sx is for the first portion 32*x* corresponding to the outer peripheral area 22*a*. The flow-path cross-sectional areas Sy1 and Sy2 are for the respective branches 32*y*1 and 32*y*2 included in the second portion 32*y* corresponding to the central area 22*b*. The smaller the flow-path cross-sectional area S, the faster the flow speed of the refrigerant flowing in the refrigerant flow path 32 and the higher the cooling efficiency. Note that the flow-path cross-sectional area S is the area of the cross section (the flow-path cross section) of the refrigerant flow path 32 (in the case of the second portion 32*y*, each of the branches 32*y*1 and 32*y*2) that is taken along a plane perpendicular to the lengthwise direction of the refrigerant flow path 32. The flow-path cross-sectional areas Sy1 and Sy2 of the respective branches 32*y*1 and 32*y*2 included in the second portion 32*y* may be designed as appropriate. In the present embodiment, the flow-path cross-sectional areas Sy1 and Sy2 are each equal to the flow-path cross-sectional area Sx of the first portion $32x$; that is, Sy1=Sy2=Sx. The flow-path cross-sectional area S of the refrigerant flow path 32 is obtained by multiplying the horizontal length, W, and the vertical length, H. The horizontal length W and the vertical length H may be designed as appropriate for the flow-path cross-sectional area S. In the present embodiment, the horizontal lengths, Wy1 and Wy2, of the respective branches $32y1$ and $32y2$ in the second portion $32y$ are each equal to the horizontal length, Wx, of the first portion $32x$; that is, Wy1=Wy2=Wx. Furthermore, the vertical lengths, Hy1 and Hy2, of the respective branches $32y1$ and $32y2$ in the second portion $32y$ are each equal to the vertical length, Hx, of the first portion $32x$; that is, Hy1=Hy2=Hx.

Now, an exemplary usage of the wafer placement table 10 will be described. The wafer placement table 10 is fixed to the inside of a semiconductor-processing chamber, which is not illustrated. The focus ring 60 is placed on the FR placement surface 24, and a wafer W is placed on the wafer placement surface 22. In this state, a direct-current voltage is applied to the electrostatic electrode 23, whereby the wafer W is attracted to the wafer placement surface 22. Meanwhile, a heat-conductive gas (such as He gas) is supplied to the gas holes 50 (the passageways extending from the lower surface of the cooling plate 30 to the wafer placement surface 22) provided in the wafer placement table 10. Accordingly, the space enclosed by the lower surface of the wafer W and the seal band on the wafer placement surface 22 is filled with the gas. Thus, heat is to be conducted in a favorable manner between the wafer W and the wafer placement surface 22. Then, a predetermined vacuum atmosphere (or a reduced-pressure atmosphere) is produced inside the chamber. Furthermore, while a process gas is supplied from a showerhead provided at the ceiling of the chamber, an RF voltage is applied to the cooling plate 30. Accordingly, plasma is generated between the wafer W and the showerhead. With the plasma, CVD film deposition or etching is performed on the wafer W.

If the wafer W is processed with plasma as described above, the input of plasma heat is greater for the outer peripheral area of the wafer W than for the central area. Therefore, the outer peripheral area of the wafer W tends to have a higher temperature than the central area. Hence, to make the temperature of the wafer W uniform, the outer peripheral area $22a$ of the wafer placement surface 22 needs to be cooled more efficiently than the central area $22b$. Considering such circumstances, in the present embodiment, the flow-path cross-sectional area S of the refrigerant flow path 32 is adjusted as described above. Consequently, in the refrigerant flow path 32, the first portion $32x$ corresponding to the outer peripheral area $22a$ exerts higher cooling efficiency than the second portion $32y$ corresponding to the central area $22b$.

In the wafer placement table 10 described above, the refrigerant flow path 32 includes the first portion $32x$ corresponding to the high-cooling-need area, and the second portion $32y$ corresponding to the low-cooling-need area. Furthermore, the second portion $32y$ continues from the first portion $32x$ and is divided at the division point $32div$ into two ways forming the branches $32y1$ and $32y2$, which run side by side. Therefore, for example, even if any of the gas holes 50 is located close to the terminal hole 56; that is, even if the width allowed for providing the refrigerant flow path 32 is small, the second portion $32y$ as a whole is allowed to have a relatively large flow-path cross-sectional area with the branches $32y1$ and $32y2$ in the second portion $32y$ being individually provided within such a width. In the refrigerant flow path 32, the flow-path cross-sectional area Sx of the first portion $32x$ corresponding to the high-cooling-need area is smaller than the total flow-path cross-sectional area Sy1+Sy2 of the branches $32y1$ and $32y2$ in the second portion $32y$ corresponding to the low-cooling-need area. Therefore, in the refrigerant flow path 32, the flow speed is faster and the cooling efficiency is higher in the first portion $32x$ corresponding to the high-cooling-need area than in the second portion $32y$ corresponding to the low-cooling-need area. Thus, the flow speed is controllable by providing one way for the first portion $32x$ corresponding to the high-cooling-need area and two or more ways for the second portion $32y$ corresponding to the low-cooling-need area, and by varying the flow-path cross-sectional area between the first portion $32x$ and the second portion $32y$. Hence, in the wafer placement table 10, adjusting the arrangement of the first portion $32x$ and the second portion $32y$; for example, locating the first portion $32x$ in correspondence with the high-cooling-need area, reduces the temperature nonuniformity at the wafer placement surface 22 and consequently increases the temperature uniformity of the wafer W. Note that the flow-path cross-sectional area S of the refrigerant flow path 32 may satisfy 1.5Sx<Sy1+Sy2<2.5Sx or 1.8Sx<Sy1+Sy2<2.2Sx.

The input of plasma heat to the wafer placement table 10 is, in general, greater for the outer peripheral area $22a$ of the wafer placement surface 22 than for the central area $22b$. Considering such a situation, the first portion $32x$ is provided at a position corresponding to the outer peripheral area $22a$ of the wafer placement surface 22, and the second portion $32y$ is provided at a position corresponding to the central area $22b$ of the wafer placement surface 22. Thus, the cooling efficiency in the outer peripheral area $22a$ of the wafer placement surface 22 is made higher than in the central area $22b$. Consequently, the temperature nonuniformity at the wafer placement surface 22 is reduced effectively.

The ceramic plate 20 has the annular focus-ring placement surface 24 provided around the wafer placement surface 22 and located at a lower level than the wafer placement surface 22. The focus-ring placement surface 24 is designed to receive the annular focus ring 60 whose outside diameter is greater than the outside diameter of the ceramic plate 20 and the outside diameter of the cooling plate 30. In such a case, the focus ring 60 extends outward beyond (overhangs) the wafer placement table 10. Therefore, the outer peripheral area $22a$ of the wafer placement surface 22 is more likely to have a high temperature. Hence, the application of the present invention provides a great significance.

The flow-path cross-sectional areas Sy1 and Sy2 of the respective branches $32y1$ and $32y2$ in the second portion $32y$ are each greater than ½ of the flow-path cross-sectional area Sx of the first portion $32x$. The greater the flow-path cross-sectional areas Sy1 and Sy2 of the branches $32y1$ and $32y2$ in the second portion $32y$, the slower the flow speeds in the branches $32y1$ and $32y2$. Consequently, the nonuniformity in heat removal is further reduced. The flow-path cross-sectional areas Sy1 and Sy2 of the branches $32y1$ and $32y2$ may each be greater than or equal to ⅔ or greater than or equal to ¾ of the flow-path cross-sectional area Sx of the first portion $32x$. The flow-path cross-sectional areas Sy1 and Sy2 of the branches $32y1$ and $32y2$ may each be smaller than or equal to 2 folds or smaller than or equal to 1.5 folds of the flow-path cross-sectional area Sx of the first portion $32x$.

The refrigerant flow path 32 includes the turn portion $32turn$ where the flow path is reversely directed. The refrigerant flow path 32 is divided at the division point 32*div* defined at a halfway position in the turn portion 32*turn* into two ways forming the branches 32*y*1 and 32*y*2 such that the unevenness in the amount of refrigerant distribution between the branches 32*y*1 and 32*y*2 in the second portion 32*y* is reduced. Thus, the unevenness in the capacity of heat removal between the branches 32*y*1 and 32*y*2 is reduced. Consequently, the nonuniformity in heat removal is further reduced.

This feature will now be described with reference to FIG. 5A to 5C illustrating the result of an examination of how refrigerant flows in a refrigerant flow path. If the refrigerant flow path has a curved shape such as a swirling shape, the flow speed tends to be faster on the outer peripheral side of the flow path (the outer side of the curve) under a centrifugal force as in part (1) illustrated in FIG. 5A. Therefore, simply dividing the flow path with a division point defined near the center of the flow path may make the amount of refrigerant distribution greater for the branch on the outer peripheral side. In contrast, if a curve includes at a halfway position thereof a turn portion having a smaller curvature (a curvature radius R of 20 mm or smaller, for example) than the preceding part of the curve (a curvature radius R of 50 mm or greater, for example), the above-mentioned centrifugal force is temporarily canceled at a halfway position in the turn portion. Accordingly, as in portion (2) illustrated in FIG. 5A, the flow speed becomes greatest near the center of the flow path, and the difference in the flow speed between the outer peripheral side (the outer side of the curve) and the inner peripheral side (the inner side of the curve) is reduced. Therefore, as illustrated in FIG. 5B for example, if the flow path is divided into two ways at a division point defined at a halfway position in the turn portion, such a design prevents refrigerant distribution from being concentrated in one of the branches. If the division point is defined at a halfway position in the turn portion, the division point may preferably be defined in a part near the center of the flow path where the flow speed is faster than on the two sides of the flow path.

In the plan view of the wafer placement table 10, a non-flow-path area, which is defined as the size of an area where the refrigerant flow path 32 is not provided, may be 50% or greater in an area over which the second portion 32*y* spreads (for example, the central area 22*b* where the cooling need is low). The greater the non-flow-path area, the higher the degree of freedom in the arrangement of elements (such as the gas holes 50, the terminal hole 56, and lift pin holes to be described below) other than the refrigerant flow path. Regarding this feature, the following cases were compared: a case where the second portion 32*y* of the refrigerant flow path 32 was not divided and had a flow-path cross-sectional area, Sy, twice that of the first portion 32*x*; and a case where the second portion 32*y* was divided into branches 32*y*1 and 32*y*2 having respective flow-path cross-sectional areas, Sy1 and Sy2, each being equal to that of the first portion 32*x* (the total cross-sectional area was twice that of the first portion 32*x*). As a result, the non-flow-path area that made the temperature nonuniformity in the wafer fall into a predetermined range (within 10° C., for example) was 41.3% in the first case and 54.6% in the second case. That is, the non-flow-path area was increased to 50% or greater. In the comparison, the material for the cooling plate was varied among a first material (Ti, for example) having a thermal conductivity of 20 W/mK, a second material having a thermal conductivity of 100 W/mK, and a third material (Al, for example) having a thermal conductivity of 200 W/mK. The first portion 32*x* was designed as follows: flow-path cross-sectional area Sx=84 mm², length Wx=7 mm, and length Hx=12 mm. In the case where the second portion 32*y* was not divided, the second portion 32*y* was designed as follows: flow-path cross-sectional area Sy=168 mm², length Wy=14 mm, and length Hy=12 mm. In the case where the second portion 32*y* was divided, the branch 32*y*1 in the second portion 32*y* was designed as follows: flow-path cross-sectional area Sy1=84 mm², length Wy1=7 mm, and length Hy1=12 mm. The branch 32*y*2 in the second portion 32*y* was designed as follows: flow-path cross-sectional area Sy2=84 mm², length Wy2=7 mm, and length Hy2=12 mm. Note that the non-flow-path area may be, for example, 70% or smaller. Furthermore, the area over which the second portion 32*y* spreads (herein, the central area 22*b*) may be defined by a minimum circumscribed circle that encloses the entirety of the branches 32*y*1 and 32*y*2.

Regarding the flow-path length, L, of the refrigerant flow path 32, the ratio, Ly1/Ly2, of the lengths, Ly1 and Ly2 (not illustrated), of the respective branches 32*y*1 and 32*y*2 may preferably be 4/5 or greater and 5/4 or smaller. Such a design reduces the difference in the pressure loss between the branch 32*y*1 and the branch 32*y*2. If, for example, the ratio Ly1/Ly2 is large, the difference in the pressure loss between the branch 32*y*1 and the branch 32*y*2 may be reduced by, for example, adjusting the cross-sectional shapes of the respective branches 32*y*1 and 32*y*2. The lengths Ly1 and Ly2 of the branches 32*y*1 and 32*y*2 may each be greater than or equal to ½ of the length, Lx, of the first portion 32*x*, or may each be greater than or equal to the length Lx of the first portion 32*x*. Alternatively, the lengths Ly1 and Ly2 of the branches 32*y*1 and 32*y*2 may each be smaller than or equal to ten folds of the length Lx of the first portion 32*x*, or may each be smaller than or equal to five folds of the length Lx of the first portion 32*x*. As another alternative, the length Lx of the first portion 32*x* and the lengths Ly1 and Ly2 of the branches 32*y*1 and 32*y*2 may each be 20 mm or greater, for example. Regarding the flow-path cross-sectional area S of the refrigerant flow path 32, the ratio, Sy1/Sy2, of the flow-path cross-sectional areas Sy1 and Sy2 of the respective branches 32*y*1 and 32*y*2 may preferably be 4/5 or greater and 5/4 or smaller. Such a design reduces the difference in the pressure loss between the branch 32*y*1 and the branch 32*y*2.

Second Embodiment

Figure 6:
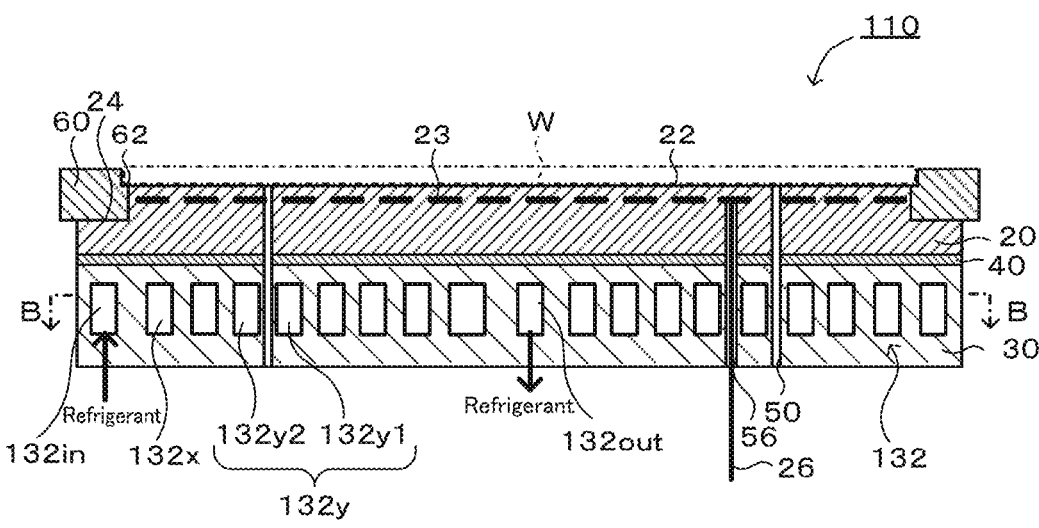
FIG. 6 is a sectional view of a wafer placement table 110.
Figure 7:
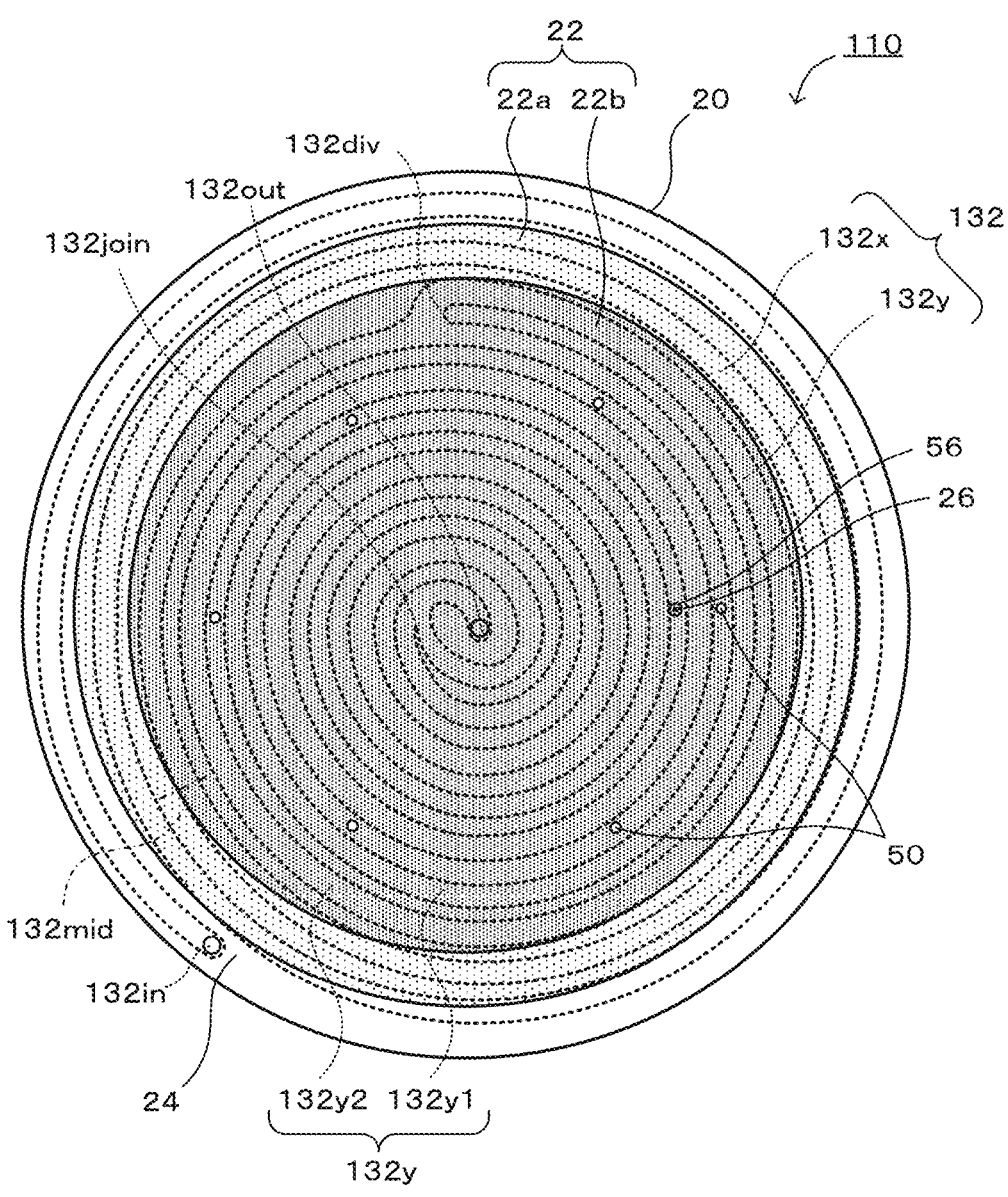
FIG. 7 is a plan view of the wafer placement table 110.
Figure 8:
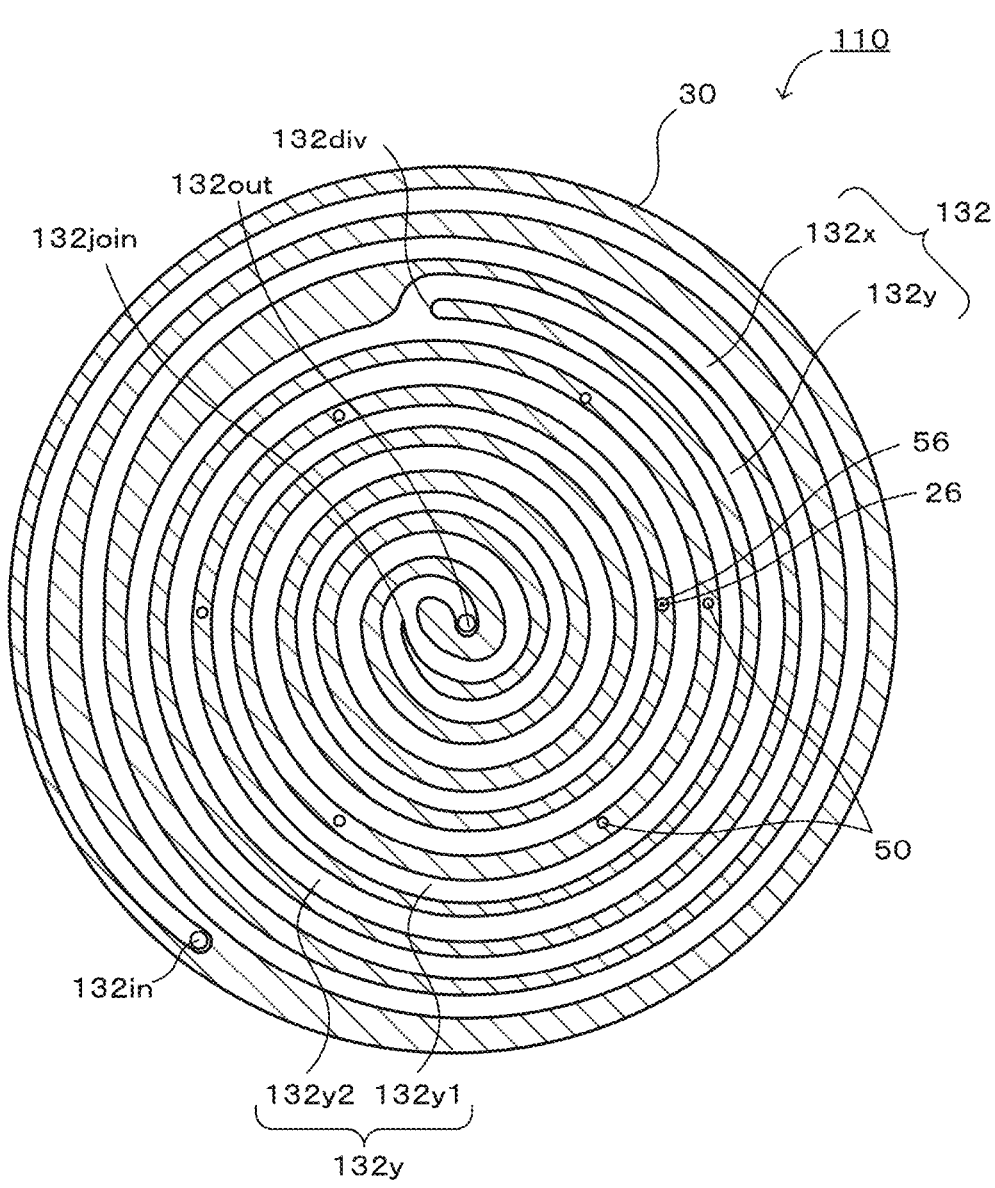
FIG. 8 illustrates a section taken along line B-B given in FIG. 6.
Figure 9:
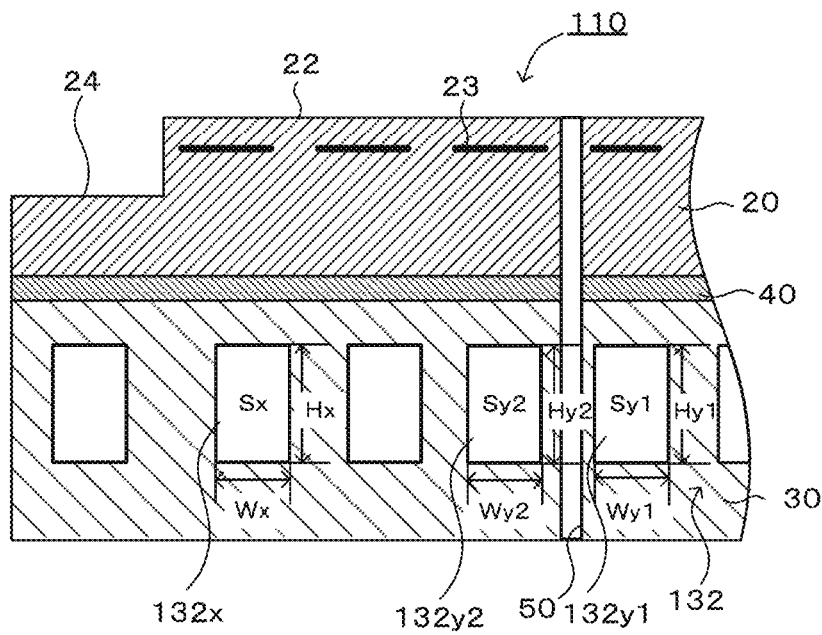
FIG. 9 is an enlargement of a part illustrated in FIG. 6.

A second embodiment of the present invention will now be described with reference to drawings. FIG. 6 is a sectional view of a wafer placement table 110 (a sectional view of the wafer placement table 110 that is taken along a plane containing the center axis of the wafer placement table 110). FIG. 7 is a plan view of the wafer placement table 110. FIG. 8 illustrates a section taken along line B-B given in FIG. 6. FIG. 9 is an enlargement of a part illustrated in FIG. 6. Elements that are illustrated in FIGS. 6 to 9 are the same as those described in the above embodiment are denoted by corresponding ones of the reference signs and are not described herein.

As illustrated in FIG. 8, in plan view, a refrigerant flow path 132 extends from one end (inlet 132*in*) thereof to the other end (outlet 132*out*) thereof in such a manner as to spread over the entirety of the ceramic plate 20. The refrigerant flow path 132 has a swirling shape. The refrigerant, the refrigerant circulator, and so forth to be employed may be the same as in the above embodiment.

As illustrated in FIG. 7, the refrigerant flow path 132 includes a first portion 132*x* and a second portion 132*y*. The first portion 132*x* corresponds to the outer peripheral area 22*a* (the high-cooling-need area) of the wafer placement surface 22. The second portion 132*y* corresponds to the central area 22*b* (the low-cooling-need area). In the refrigerant flow path 132, the first portion 132*x* corresponding to the outer peripheral area 22*a* is a portion of the refrigerant flow path 132 that extends from the inlet 132 in to a middle position 132*mid*. In the refrigerant flow path 132, the second portion 132*y* corresponding to the central area 22*b* is a portion of the refrigerant flow path 132 that extends from the middle position 132*mid* to the outlet 132*out*. The second portion 132*y* is divided at a division point 132*div* into two ways forming a branch 132*y*1 and a branch 132*y*2, which join at a joining point 132*join* before reaching the outlet 132*out*.

The refrigerant flow path 132 is designed to be divided at the division point 132*div* into the branch 132*y*1, which has a tendency continuing from the curve preceding the division; and the branch 132*y*2, which temporarily deviates outward from the tendency of the preceding curve. Such a design prevents refrigerant distribution from being concentrated in one of the branches 132*y*1 and 132*y*2.

Letting the flow-path cross-sectional area of the refrigerant flow path 132 be S, a flow-path cross-sectional area Sx is smaller than the sum of flow-path cross-sectional areas Sy1 and Sy2; that is, Sx<Sy1+Sy2. The flow-path cross-sectional area Sx is for the first portion 132*x* corresponding to the outer peripheral area 22*a*. The flow-path cross-sectional areas Sy1 and Sy2 are for the respective branches 132*y*1 and 132*y*2 included in the second portion 132*y* corresponding to the central area 22*b*. Therefore, in the refrigerant flow path 132, the flow speed is faster and the cooling efficiency is higher in the first portion 132*x* corresponding to the high-cooling-need area than in the second portion 132*y* corresponding to the low-cooling-need area. Note that the flow-path cross-sectional area S, the horizontal length W, and the vertical length H of the refrigerant flow path 132 follow the flow-path cross-sectional area S, the horizontal length W, and the vertical length H of the refrigerant flow path 32.

The usage of the wafer placement table 110 follows the manufactured product or usage of the wafer placement table 10 and is not described herein.

In the wafer placement table 110 described above, likewise in the wafer placement table 10 described further above, the flow speed is controlled by providing one way for the first portion 132*x* corresponding to the high-cooling-need area and two or more ways for the second portion 132*y* corresponding to the low-cooling-need area, and by varying the flow-path cross-sectional area between the first portion 132*x* and the second portion 132*y*. Thus, in the wafer placement table 110, the temperature nonuniformity at the wafer placement surface 22 is reduced. Consequently, the temperature uniformity of the wafer W is increased.

The refrigerant flow path 132 is designed to be divided at the division point 132*div* into the branch 132*y*1 that has a tendency continuing from the curve preceding the division, and the branch 132*y*2 that temporarily deviates outward from the tendency of the preceding curve. Such a design prevents refrigerant distribution from being concentrated in one of the branches 132*y*1 and 132*y*2. Thus, the unevenness in the capacity of heat removal between the branches 132*y*1 and 132*y*2 is reduced. Consequently, the nonuniformity in heat removal is further reduced. Note that the branch 132*y*2 may extend at an angle of 30° or greater and 90° or smaller with respect to the branch 132*y*1.

Regarding this feature, as described above with reference to FIG. 5A to 5C, the flow speed tends to be faster on the outer peripheral side of the flow path (the outer side of the curve). Therefore, simply dividing the flow path with a division point defined near the center of the flow path may make the amount of refrigerant distribution greater for the branch on the outer peripheral side. Hence, if the division point is defined in, for example, part (1) illustrated in FIG. 5A, the division point is defined near the outer periphery, for example, of the flow path preceding the division as illustrated in FIG. 5C. Thus, the flow path is divided into a branch that has a tendency continuing from the curve preceding the division, and a branch that temporarily deviates outward from the tendency of the preceding curve. In such a design, the branch on the inner peripheral side (the inner side of the curve) serves as the main flow path, and the amount of refrigerant distribution for the branch on the outer peripheral side (the outer side of the curve) is therefore reduced. Consequently, such a design prevents refrigerant distribution from being concentrated in one of the branches.

In plan view, the non-flow-path area that is defined as the size of an area where the refrigerant flow path 132 is not provided may be 50% or greater in an area over which the second portion 132*y* spreads (for example, the central area 22*b* where the cooling need is low). The greater the non-flow-path area, the higher the degree of freedom in the arrangement of elements (such as the gas holes 50, the terminal hole 56, and lift pin holes to be described below) other than the refrigerant flow path. The non-flow-path area may be, for example, 70% or smaller.

The length L and the flow-path cross-sectional area S of the refrigerant flow path 132 may follow the length L and the flow-path cross-sectional area S of the refrigerant flow path 32, whereby the difference in the pressure loss between the branch 132*y*1 and the branch 132*y*2 may be reduced.

Note that the present invention is not limited in any way to the embodiment above, and it goes without saying that the present invention can be carried out in various modes as long as the modes pertain to the technical scope of the present invention.

For example, according to each of the first and second embodiments described above, the refrigerant flow path 32 or 132 is divided into two ways. Alternatively, the refrigerant flow path 32 or 132 may be divided into three or more ways. Furthermore, the location of the division point 32*div* or 132*div* of the refrigerant flow path 32 or 132 is not limited to the one described above and may be designed as appropriate such that the refrigerant is to be distributed by desired amounts to the respective branches 32*y*1 and 32*y*2 or branches 132*y*1 and 132*y*2.

According to each of the first and second embodiments described above, the refrigerant flow path 32 or 132 join at the joining point 32*join* or 132*join*. Alternatively, the refrigerant flow path 32 or 132 may reach, without joining, outlets provided for the respective branches 32*y*1 and 32*y*2 or branches 132*y*1 and 132*y*2.

According to each of the first and second embodiments described above, the high-cooling-need area is the outer peripheral area 22*a* of the wafer placement surface 22, and the low-cooling-need area is the central area 22*b* of the wafer placement surface 22. However, the present invention is not particularly limited to such an embodiment.

In each of the first and second embodiments described above, in the wafer placement surface 22, the efficiency of heat exchange in the outer peripheral area 22*a* corresponding to the first portion 32*x* or 132*x* may be higher than the efficiency of heat exchange in the central area 22*b* corresponding to the second portion 32*y* or 132*y*. In the case of the wafer placement table 10, the efficiency of heat exchange is calculable as follows. First, a first chiller capable of causing the refrigerant to circulate while controlling the temperature of the refrigerant is connected to the inlet 32 in and the outlet 32*out* of the refrigerant flow path 32. Then, a refrigerant having the same temperature as the room temperature (25° C., for example) is caused to circulate in the refrigerant flow path 32. Meanwhile, another refrigerant having a predetermined temperature (80 to 100° C., for example) is prepared with a second chiller. Then, using a valve, the refrigerant is switched from the one having the same temperature as the room temperature to the one having the predetermined temperature, whereby the refrigerant having the predetermined temperature is caused to circulate in the refrigerant flow path 32. At the elapse of a predetermined period of time (ten seconds, for example) after the switching of the refrigerant, the temperature distribution at the wafer placement surface 22 is measured. With reference to the temperature distribution, the rate of temperature rise (the amount of temperature rise per unit time (° C./second)) is calculated. The calculated rate of temperature rise is used as an index for the efficiency of heat exchange. For example, when the refrigerant in the wafer placement table 10 is switched from a refrigerant at 25° C. to a refrigerant at 80° C., the rate of temperature rise in the outer peripheral area 22*a* of the wafer placement surface 22 is 5.5° C./second or higher, whereas the rate of temperature rise in the central area 22*b* is 5° C./second or lower. This shows that the efficiency of heat exchange in the outer peripheral area 22*a* is higher than the efficiency of heat exchange in the central area 22*b*. Note that the rate of temperature rise at the boundary between the outer peripheral area 22*a* and the central area 22*b* is the mid value between the values for the respective areas.

According to each of the first and second embodiments described above, the electrostatic electrode 23 is provided inside the ceramic plate 20 at such a position as to face the wafer placement surface 22. In addition, an FR attraction electrode for electrostatically attracting the focus ring 60 may be provided inside the ceramic plate 20 at such a position as to face the FR placement surface 24.

The first and second embodiments described above each relate to an exemplary case where the ceramic plate 20 has the wafer placement surface 22 and the FR placement surface 24. However, the present invention is not particularly limited to such an embodiment. For example, the ceramic plate 20 may be a plate having the wafer placement surface 22 but no FR placement surface 24.

The first and second embodiments described above each relate to an exemplary case where the outside diameter of the focus ring 60 is greater than the outside diameter of the wafer placement table 10 (the outside diameter of the ceramic plate 20 and the outside diameter of the cooling plate 30). However, the present invention is not particularly limited to such an embodiment. For example, the outside diameter of the focus ring 60 may be equal to the outside diameter of the wafer placement table 10.

According to each of the first and second embodiments described above, the refrigerant flow path 32 or 132 has a swirling shape in plan view. However, the present invention is not particularly limited to such an embodiment. For example, the refrigerant flow path 32 or 132 may have a zigzag shape in plan view.

The first and second embodiments described above each relate to an exemplary case where the wafer placement table 10 or 110 includes the ceramic plate 20 provided thereinside with the electrostatic electrode 23. However, the present invention is not particularly limited to such an embodiment. For example, the ceramic plate 20 may be provided thereinside with a heater electrode (resistance heating element) or a plasma-generating electrode (RF electrode) in replacement of or in addition to the electrostatic electrode 23.

In each of the first and second embodiments described above, the wafer placement table 10 or 110 may have a plurality of lift pin holes each extending through the wafer placement table 10 or 110 from top to bottom. Such lift pin holes are holes intended to receive lift pins with which the wafer W is moved up and down relative to the wafer placement surface 22. In the plan view of the wafer placement surface 22, the plurality of lift pin holes are arranged, for example, at regular intervals along a circle concentric to the wafer placement surface 22.

International Application No. PCT/JP2023/021151, filed on Jun. 7, 2023, is incorporated herein by reference in its entirety.

What is claimed is:
1. A wafer placement table comprising:
a ceramic plate having a wafer placement surface on an upper surface of the ceramic plate;
a cooling plate provided on a lower surface of the ceramic plate; and
a refrigerant flow path provided inside the cooling plate,
wherein the refrigerant flow path includes a first portion and a second portion, the second portion continuing from the first portion and being divided into two or more ways forming branches that run side by side, and
wherein the first portion has a cross-sectional area smaller than a sum of cross-sectional areas of the respective branches included in the second portion, and
wherein the refrigerant flow path includes a curved turn portion where the flow path is reversely directed, the refrigerant flow path being divided into two ways at a halfway position of the curve in the turn portion such that unevenness in an amount of refrigerant distribution between the branches in the second portion is reduced.
2. The wafer placement table according to claim 1,
wherein the first portion is located in correspondence with an outer peripheral area of the wafer placement surface, and the second portion is located in correspondence with a central area of the wafer placement surface.
3. The wafer placement table according to claim 2,
wherein the ceramic plate has an annular focus-ring placement surface provided around the wafer placement surface and located at a lower level than the wafer placement surface, the focus-ring placement surface being designed to receive an annular focus ring whose outside diameter is greater than an outside diameter of the ceramic plate and an outside diameter of the cooling plate.
4. The wafer placement table according to claim 1,
wherein the cross-sectional areas of the respective branches in the second portion are each greater than ½ of the cross-sectional area of the first portion.
5. The wafer placement table according to claim 1,
wherein the refrigerant flow path is curved preceding the division and divided into a branch that has a tendency continuing from a curve preceding the division, and a branch that temporarily deviates outward of the curve from the tendency of the preceding curve, and such that unevenness in an amount of refrigerant distribution between the branches in the second portion is reduced.

6. The wafer placement table according to claim 1,
wherein, in plan view, a non-flow-path area that is defined as a size of an area where the refrigerant flow path is not provided is 50% or greater in an area over which the second portion spreads.

7. The wafer placement table according to claim 1,
wherein the two or more ways forming branches are rejoined before reaching a refrigerant flow outlet.

8. The wafer placement table according to claim 1,
wherein the second portion continuing from the first portion and being divided into two or more ways forming branches that run side by side are parallel to one another, and with the refrigerant flow path being in a same direction with respect to the two or more ways forming branches.

9. A wafer placement table comprising:
a ceramic plate having a wafer placement surface on an upper surface of the ceramic plate;

a cooling plate provided on a lower surface of the ceramic plate; and a refrigerant flow path provided inside the cooling plate,
wherein the refrigerant flow path includes a first portion and a second portion, the second portion continuing from the first portion and being divided into two or more ways forming branches that run side by side, and wherein the first portion has a cross-sectional area smaller than a sum of cross-sectional areas of the respective branches included in the second portion, and wherein the refrigerant flow path is curved preceding the division and divided into a branch that has a tendency continuing from a curve preceding the division, and a branch that temporarily deviates outward of the curve from the tendency of the preceding curve, and such that unevenness in an amount of refrigerant distribution between the branches in the second portion is reduced.

\* \* \* \* \*